United States Patent
Moon et al.

(10) Patent No.: US 10,121,899 B2
(45) Date of Patent: Nov. 6, 2018

(54) THIN FILM TRANSISTOR SUBSTRATE AND DISPLAY USING THE SAME

(71) Applicant: LG DISPLAY CO., LTD., Seoul (KR)

(72) Inventors: Kyeongju Moon, Gyeonggi-do (KR); Soyoung Noh, Gyeonggi-do (KR); Hyunsoo Shin, Gyeonggi-do (KR); Wonkyung Kim, Busan (KR)

(73) Assignee: LG Display Co., Ltd., Seoul (KR)

( * ) Notice: Subject to any disclaimer, the term of this patent is extended or adjusted under 35 U.S.C. 154(b) by 88 days.

(21) Appl. No.: 15/352,951

(22) Filed: Nov. 16, 2016

(65) Prior Publication Data
US 2017/0155000 A1 Jun. 1, 2017

(30) Foreign Application Priority Data
Nov. 26, 2015 (KR) .................. 10-2015-0166448

(51) Int. Cl.
*H01L 29/786* (2006.01)
*H01L 27/12* (2006.01)
(Continued)

(52) U.S. Cl.
CPC ...... *H01L 29/78606* (2013.01); *H01L 27/124* (2013.01); *H01L 27/127* (2013.01);
(Continued)

(58) Field of Classification Search
CPC ........... H01L 29/78606; H01L 29/7869; H01L 29/78633; H01L 29/78675; H01L 27/124;
(Continued)

(56) References Cited

U.S. PATENT DOCUMENTS

2011/0049523 A1* 3/2011 Choi .................. H01L 27/1225
257/72
2013/0168666 A1* 7/2013 Yan ..................... H01L 27/1251
257/43
(Continued)

FOREIGN PATENT DOCUMENTS

KR  20150101413 A  9/2015

OTHER PUBLICATIONS

European Search Report, dated Apr. 10, 2016 from The European Patent Office in counterpart application No. 16200472.5.

*Primary Examiner* — Matthew Reames
*Assistant Examiner* — Scott Bauman
(74) *Attorney, Agent, or Firm* — Morgan, Lewis & Bockius LLP

(57) ABSTRACT

A thin film transistor substrate includes a first thin film transistor disposed having a polycrystalline semiconductor layer, a first gate electrode on the polycrystalline semiconductor layer, a first source electrode and a first drain electrode; a first gate insulating layer between the polycrystalline semiconductor layer and the first gate electrode; a second thin film transistor disposed having an oxide semiconductor layer on the first gate electrode, a second gate electrode on the oxide semiconductor layer, a second source electrode and a second drain electrode; an intermediate insulating layer disposed on the first gate electrode and under the oxide semiconductor layer; and a second gate insulating layer on the intermediate insulating layer and under the first source electrode, the first drain electrode and the second gate electrode.

12 Claims, 11 Drawing Sheets

(51) Int. Cl.
  *G02F 1/1343* (2006.01)
  *G02F 1/1362* (2006.01)
  *H01L 27/32* (2006.01)
  *G02F 1/1368* (2006.01)

(52) U.S. Cl.
  CPC ...... *H01L 27/1222* (2013.01); *H01L 27/1225* (2013.01); *H01L 29/7869* (2013.01); *H01L 29/78633* (2013.01); *H01L 29/78675* (2013.01); *G02F 1/1368* (2013.01); *G02F 1/134309* (2013.01); *G02F 1/136286* (2013.01); *G02F 2001/134372* (2013.01); *G02F 2201/121* (2013.01); *H01L 27/3262* (2013.01)

(58) Field of Classification Search
  CPC ............. H01L 27/1222; H01L 27/1225; H01L 27/127; H01L 27/3262; G02F 2201/121; G02F 2001/134372; G02F 1/1368; G02F 1/136286; G02F 1/134309
  USPC .......................................................... 257/43
  See application file for complete search history.

(56) References Cited

U.S. PATENT DOCUMENTS

| | | | |
|---|---|---|---|
| 2013/0214279 A1* | 8/2013 | Nishimura | G02F 1/13338 257/59 |
| 2015/0055051 A1 | 2/2015 | Osawa et al. | |
| 2015/0187860 A1* | 7/2015 | Seo | H01L 27/3276 257/40 |
| 2015/0243685 A1 | 8/2015 | Lee et al. | |
| 2015/0243724 A1* | 8/2015 | Cho | H01L 29/7869 257/43 |
| 2016/0063924 A1* | 3/2016 | Oh | H01L 27/1229 345/690 |
| 2016/0307936 A1* | 10/2016 | Shin | H01L 27/1251 |
| 2016/0322402 A1* | 11/2016 | Kim | H01L 27/1255 |

* cited by examiner

THIN FILM TRANSISTOR SUBSTRATE AND DISPLAY USING THE SAME

This application claims the benefit of Korea Patent Application No. 10-2015-0166448 filed on Nov. 26, 2015, which is incorporated herein by reference for all purposes as if fully set forth herein.

BACKGROUND

Field of the Invention

The present disclosure relates to a thin film transistor substrate, and more particularly, to a thin film transistor substrate having two different type thin film transistors on the same substrate, and a method for manufacturing the same.

Discussion of the Related Art

Nowadays, as the information society is developed, the requirements of displays for representing information are increasing. Accordingly, the various flat panel displays (or 'FPD') are developed for overcoming many drawbacks of the cathode ray tube (or 'CRT') such as heavy weight and bulk volume. The flat panel display devices include the liquid crystal display device (or 'LCD'), the plasma display panel (or 'PDP'), the organic light emitting display device (or 'OLED') and the electrophoresis display device (or 'ED').

The display panel of a flat panel display may include a thin film transistor substrate having a thin film transistor allocated in each pixel region arrayed in a matrix manner. For example, the liquid crystal display device (or 'LCD') represents video data by controlling the light transitivity of the liquid crystal layer using the electric fields. For the organic light emitting diode display represents the video data by generating properly controlled light at each pixel disposed in a matrix manner as an organic light emitting diode is formed therein.

As a self-emitting display device, the organic light emitting diode display device has the merits those the response speed is very fast, the brightness is very high and the view angle is large. The organic light emitting diode display (or OLED) using the organic light emitting diode having the good energy efficiencies can be categorized in the passive matrix type organic light emitting diode display (or PMOLED) and the active matrix type organic light emitting diode display (or AMOLED).

As the personal appliances are more prevailed, portable and/or wearable devices are actively developed. To apply the display device for the portable and/or wearable device, the device has the characteristics of the low power consumption. However, using the technologies having developed until now, it is restricted to get display having the excellent low power consumption properties.

SUMMARY

Accordingly, the present invention is directed to a thin film transistor substrate and a display using the same that substantially obviate one or more of the problems due to limitations and disadvantages of the related art.

An object of the present disclosure is to provide a thin film transistor substrate for flat panel display having at least two transistors of which characteristics are different each other on the same substrate, and a display using the same substrate. Another object of the present disclosure is to provide a method for manufacturing a thin film transistor substrate for flat panel display having two different type transistors by the optimized processes and the minimized number of the mask processes, and a thin film transistor substrate and a display using the same substrate by the same method.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor substrate comprises a first thin film transistor disposed including a polycrystalline semiconductor layer, a first gate electrode on the polycrystalline semiconductor layer, a first source electrode and a first drain electrode; a first gate insulating layer between the polycrystalline semiconductor layer and the first gate electrode; a second thin film transistor disposed including an oxide semiconductor layer on the first gate electrode, a second gate electrode on the oxide semiconductor layer, a second source electrode and a second drain electrode; an intermediate insulating layer disposed on the first gate electrode and under the oxide semiconductor layer; and a second gate insulating layer on the intermediate insulating layer and under the first source electrode, the first drain electrode and the second gate electrode.

In one embodiment, the first source electrode contacts the polycrystalline semiconductor layer through a first source contact hole penetrating the second gate insulating layer, the intermediate insulating layer and the first gate insulating layer; the first drain electrode contacts the polycrystalline semiconductor layer through a first drain contact hole penetrating the second gate insulating layer, the intermediate insulating layer and the first gate insulating layer; and the second gate electrode overlaps with middle portions of the oxide semiconductor layer having the second gate insulating layer there-between.

In one embodiment, the second gate insulating layer includes: a first portion having a same shape with the first source electrode; a second portion having a same shape with the first drain electrode; and a third portion having a same shape with the second gate electrode.

In one embodiment, the intermediate insulating layer includes: a nitride layer; and an oxide layer on the nitride layer.

In one embodiment, the thin film transistor substrate further comprises: a first light shielding layer under the polycrystalline semiconductor layer; and a second light shielding layer formed at same layer and of same material with the first gate electrode, and disposed under the oxide semiconductor layer.

In another aspect, a thin film transistor substrate comprises a first semiconductor layer including a polycrystalline semiconductor material; a first gate insulating layer covering the first semiconductor layer; a first gate electrode disposed on the gate insulating layer and overlapping with the first semiconductor layer; an intermediate insulating layer covering the first gate electrode; a second semiconductor layer disposed on the intermediate insulating layer, including an oxide semiconductor material; a second gate insulating layer overlapping with middle portions of the second semiconductor layer and one side and other side of the first semiconductor layer; a second gate electrode disposed on the second gate insulating layer and overlapping with the middle portions of the second semiconductor layer; a first source electrode disposed on the second gate insulating layer, and connecting the one side of the first semiconductor layer; and a first drain electrode disposed on the second gate insulating layer, and connecting the other side of the first semiconductor layer.

In one embodiment, the first source electrode contacts the one portion of the first semiconductor layer through a first source contact hole penetrating the second gate insulating layer, the intermediate insulating layer and the first gate insulating layer; and the first drain electrode contacts the other portion of the first semiconductor layer through a first drain contact hole penetrating the second gate insulating layer, the intermediate insulating layer and the first gate insulating layer.

In one embodiment, the second gate insulating layer includes: a first portion having a same shape with the first source electrode; a second portion having a same shape with the first drain electrode; and a third portion having a same shape with the second gate electrode.

In one embodiment, the intermediate insulating layer includes: a nitride layer; and an oxide layer on the nitride layer.

In one embodiment, the thin film transistor further comprises: a passivation layer covering the first source electrode, the first drain electrode and the second gate electrode; and a second source electrode and a second drain electrode disposed on the passivation layer, and connecting one side of the second semiconductor layer and other side of the second semiconductor layer, respectively.

The thin film transistor substrate for flat panel display according to the present disclosure comprises two different type thin film transistors on the same substrate, so that the demerit of any one type thin film transistor can be compensated by the other type thin film transistor. Especially, including the thin film transistor having the low frequency driving characteristics, the display can have the low power consumption property and it can be applied to the portable and/or wearable appliances.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
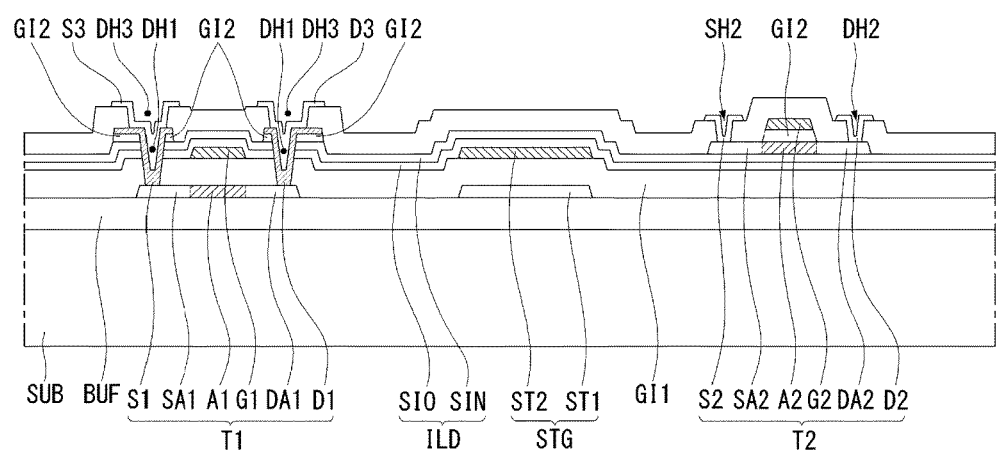
FIG. 1 is a cross sectional view illustrating a structure of a thin film transistor substrate for a flat panel display in which two different type thin film transistors are formed, according to the first embodiment of the present disclosure.

Hereinafter, the meaning for the term of "on" includes "directly on" and "indirectly on" in all scopes of the specifications. Of course, the meaning for the term of "under" includes "directly under" and "indirectly under" in all scopes of the specifications.

Referring to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected for ease of explanation and may be different from actual names.

The thin film transistor substrate for a flat panel display according to the present disclosure comprises a first thin film transistor disposed in a first area and a second thin film transistor disposed in a second area, on the same substrate. The substrate may include a display area and a non-display area. In the display area, a plurality of pixel area is arrayed in a matrix manner. In one pixel area, the display elements are disposed. In the non-display area surrounding the display area, the driver elements for driving the display elements in the pixel area are disposed.

Here, the first area may be the non-display area, and the second area may be some portions or all portions of the display area. In this case, the first thin film transistor and the second thin film transistor are disposed as they may be apart from each other. Otherwise, the first area and the second area may be included in the display area. Especially, for the case that a plurality of thin film transistor are disposed in one pixel area, the first thin film transistor and the second thin film transistor may be closely disposed.

As the polycrystalline semiconductor material has the characteristics of high mobility (over 100 cm²/Vs) and of low energy consumption power, and it has high reliability, it is proper to apply to the driver IC, such as the gate driver and/or the multiplexer (or 'MUX') for driving the display elements. In addition, it can be applied to the driving thin film transistor disposed in the pixel area of the organic light emitting diode display. As the oxide semiconductor material has low off-current, it is proper to apply to the channel layer of the switching thin film transistor in the pixel area, in which the ON time period is very short but the OFF time period is long. Further, as the off-current is low, the holding time of the pixel voltage may be long, so that it is preferable to apply the display requiring the low frequency drive and/or low power consumption. By disposing these two different type thin film transistors, the present disclosure suggests a thin film transistor substrate having an optimized function and characteristic for the portable and/or wearable displays.

When the semiconductor layer is formed using the polycrystalline semiconductor material, the doping process and high temperature treatment process are required. On the contrary, when the semiconductor layer is formed using the oxide semiconductor material, it is performed under the relatively lower temperature process. Therefore, it is preferable that the polycrystalline semiconductor layer, performed under severer heat condition, is firstly formed after that the oxide semiconductor layer is formed lately.

Further, in the view of manufacturing process, when the polycrystalline semiconductor material has a lot of vacancy, the characteristics may be severely degraded. Therefore, it is required to perform the hydrogenation process in which the vacancies are filled with hydrogen particles. This process can be performed by a post-thermal process under 350~380° C. temperature condition. For the hydrogenation process, a nitride layer having a lot of hydrogen particles is required over the polycrystalline semiconductor layer (or material). As the materials used for depositing the nitride layer has a large amount of hydrogen, a lot of hydrogen particles may be included into the deposited nitride layer. By the thermal process, the hydrogen particles can be diffused into the polycrystalline semiconductor material. As the result, the polycrystalline semiconductor layer can be stabilized.

Hereinafter, in convenient, the first thin film transistor is for the driver IC disposed in the non-display area and the second thin film transistor is for the display element disposed in the pixel area of the display area. However, they are not restricted to this case only. For example of the organic light emitting diode display, the first thin film transistor and the second thin film transistor are disposed at one pixel area in the display area. Especially, the first thin film transistor having the polycrystalline semiconductor material may be applied for the driving thin film transistor, and the second thin film transistor having the oxide semiconductor material may be applied for the switching thin film transistor.

First Embodiment

Referring to FIG. 1, we will explain about the first embodiment of the present disclosure. FIG. 1 is a cross sectional view illustrating a structure of a thin film transistor substrate for a flat panel display in which two different type thin film transistors are formed, according to the first embodiment of the present disclosure. Here, we will explain with the cross sectional views mainly because it clearly shows the main features of the present disclosure, in convenience, the plane view is not used.

Referring to FIG. 1, the thin film transistor substrate for a flat panel display according to the first embodiment comprises a first thin film transistor T1 and a second thin film transistor T2 which are disposed on the same substrate SUB. The first and second thin film transistors T1 and T2 may be apart far from each other, or they may be disposed within a relatively closed distance. Otherwise these two thin film transistors are disposed as being overlapped each other.

On the whole surface of the substrate SUB, a buffer layer BUF is deposited. In some cases, the buffer layer BUF may not be included. Otherwise, the buffer layer BUF may be a plurality of layers. Here, in convenience, we will explain with the single layer. Further, a light shield layer may be included at some required areas between the substrate SUB and the buffer layer BUF. The light shield layer may be further disposed for preventing the light from inducing into the semiconductor layer of the thin film transistor disposed thereon.

On the buffer layer BUF, a first semiconductor layer A1 is disposed. The first semiconductor layer A1 includes a channel area of the first thin film transistor T1. The channel area is defined as the overlapped area between the first gate electrode G1 and the first channel layer A1. As the first gate electrode G1 is overlapped with the middle portions of the first semiconductor layer A1, the middle portions of the first semiconductor layer A1 is the channel area. The two areas expanded to both sides of the channel area where the impurities are doped are defined as the first source area SA1 and the first drain area DA1, respectively. Further, using the same material with the first semiconductor layer A1, a first storage electrode ST1 of the storage capacitance is formed.

For the case that the first thin film transistor T1 is for driver IC, it is preferable that the semiconductor layer has a characteristics for high speeding performance with a lower power consumption. For example, P-MOS type or N-MOS type thin film transistor may be used or C-MOS type may be applied for the first thin film transistor T1. The P-MOS, N-MOS and/or C-MOS type thin film transistor preferably has the polycrystalline semiconductor material, such as poly-crystalline silicon (p-Si). Further, the first thin film transistor T1 preferably has the top gate structure.

On the whole surface of the substrate SUB having the first semiconductor layer A1, a first gate insulating layer GI1 is deposited. The first gate insulating layer GI1 may be made of the silicon oxide (SiOx). It is preferable that the first gate insulating layer GI1 has thickness of 1,000 Å~4,000 Å, by considering the stability and characteristics of the semiconductor elements.

On the first gate insulating layer GI1, a first gate electrode G1 and a second storage electrode ST2 are formed. The first gate electrode G1 is disposed as overlapping with the middle portions of the first semiconductor layer A1. The second storage electrode ST2 is disposed as overlapping with the first storage electrode ST1. At the first gate insulating layer GI1 where the first storage electrode ST1 and the second storage electrode ST2 are overlapped, the storage capacitance STG is formed.

An intermediate insulating layer ILD is deposited as covering the first gate electrode G1 and the second storage electrode ST2. It is preferable that the intermediate insulating layer ILD is made of a nitride layer SIN including silicon nitride (SiNx). Otherwise, it is preferable that the intermediate insulating layer ILD has the multi layer structure in which the nitride layers SIN including the silicon nitride (SiNx), and the oxide layers SIO including the silicon oxide (SiOx) are alternatively stacked. Here, in convenience, we will explain about the case of the double layer structure in which the oxide layer SIO is disposed on the nitride layer SIN.

The nitride layer SIN is deposited for performing the hydrogenation process to the first semiconductor layer A1 having the polycrystalline silicon by diffusing the hydrogen particles into the polycrystalline silicon. On the contrary, the oxide layer SIO is for preventing the hydrogen particles of the nitride layer SIN from being diffused too much into the semiconductor material of the second thin film transistor T2.

For example, the hydrogen going out from the nitride layer SIN may diffuse into the first semiconductor layer A1 including the poly-crystalline semiconductor material under the gate insulating layer GI. Therefore, the nitride layer SIN is preferably deposited as being closed to the gate insulating layer GI as possible. On the contrary, the hydrogen going out from the nitride layer SIN would not diffuse too much into the oxide semiconductor material of the second thin film transistor T2 thereon. Therefore, on the nitride layer SIN, the oxide layer SIO should be deposited. Considering the manufacturing process, it is preferable that the intermediate insulating layer ILD has the thickness of 2,000 Å~6,000 Å. Therefore, each thickness of the nitride layer SIN and the oxide layer SIO have preferably thickness of 1,000 Å~3,000 Å, respectively. In order that much more amount of the hydrogen particles from the nitride layer SIN would be diffused into the first semiconductor layer A1, but the hydrogen particles would not affect to the second semiconductor layer A2, it is preferable that the oxide layer SIO is thicker than the gate insulating layer GI. Further, as the oxide layer SIO is for controlling the hydrogen diffusion amount, it is preferable that the oxide layer SIO is thicker than the nitride layer SIN.

Especially, on the oxide layer SIO of the intermediate insulating layer ILD, a second semiconductor layer A2 is disposed where the second thin film transistor T2 would be formed. The second semiconductor layer A2 includes the channel area of the second thin film transistor T2. For the case that the second thin film transistor T2 is applied for the display element, it is preferable that the second semiconductor layer A2 has the characteristics proper to perform the switching element. For example, it is preferable that the second semiconductor layer A2 includes an oxide semiconductor material such as an indium gallium zinc oxide (or 'IGZO), an indium gallium oxide (or 'IGO'), or an indium zinc oxide (or 'IZO'). The oxide semiconductor material has a merit for driving the device with relatively low frequency. Thanks to these characteristics, the pixels may have long period for holding the pixel voltage, so that it is preferable to apply the display requiring the low frequency drive and/or the low power consumption. For the second thin film transistor T2, considering the stability of the elements, it is preferable that the second thin film transistor T2 has the top gate structure.

On the second semiconductor layer A2 and the intermediate insulating layer ILD, a second gate electrode G2 and a first source-drain electrode S1-D1 are disposed. The second gate electrode G2 is disposed as overlapping with the middle portions of the second semiconductor layer A2, the channel area, having the second gate insulating layer GI2 there-between. The second gate electrode G2 and the second gate insulating layer GI2 may have the same size and shape.

Furthermore, the first source electrode S1 and the first drain electrode D1 is disposed as facing each other with a predetermined distance across the first gate electrode G1. The first source electrode S1 is connected to one side of the first semiconductor layer A1, a first source area SA1 through a first source contact hole SH1. The first source contact hole SH1 exposes the one side of the first semiconductor layer A1, the first source area SA1, by penetrating the second gate insulating layer GI2 and the intermediate insulating layer ILD. The first drain electrode D1 is connected to the other side of the first semiconductor layer A1, a first drain area DA1, through a first drain contact hole DH1. The first drain contact hole DH1 exposes the other side of the first semiconductor layer A1, the first drain area DA1, by penetrating the second gate insulating layer GI2 and the intermediate insulating layer ILD.

The second gate electrode G2 and the first source-drain electrode S1-D1 are formed with the same material at the same manufacturing step. Further, they are patterned with the second gate insulating layer GI2 deposited under the second gate electrode G2 and the first source-drain electrode S1-D1. Therefore, the second gate electrode G2 has the same shape with the second gate insulating layer GI2 deposited there-under. In addition, the first source-drain electrode S1-D1 has the same circumference shape with that of the second gate insulating layer GI2 disposed there-under.

On the substrate SUB having the second gate electrode G2 and the first source-drain electrode S1-D1, a passivation layer PAS is deposited. The passivation layer PAS includes a second source contact hole SH2 and a second drain contact hole DH2 exposing a second source area SA2, the one side of the second semiconductor layer A2, and a second drain area DA2, the other side of the second semiconductor layer A2, respectively. Further, the passivation layer PAS includes a third source contact hole SH3 and a third drain electrode DH3 exposing the first source electrode S1 and the first drain electrode D1, respectively.

On the passivation layer PAS, a second source-drain electrode S2-D2 is formed. The second source electrode S2 and the second drain electrode D2 are disposed as being separated each other from the second gate electrode G2. The second source electrode S2 contacts the second source area SA2 exposed through the second source contact hole SH2. The second drain electrode D2 contacts the second drain area DA2 exposed through the second drain contact hole DH2. The third source electrode S3 contacts the first source electrode S1 exposed through the third source contact hole SH3. The third drain electrode D3 contacts the first drain electrode D1 exposed through the third drain contact hole DH3.

On the first thin film transistor T1 and the second thin film transistor T2, an additional passivation layer may be further deposited. In addition, by patterning the additional passivation layer, contact holes for exposing the third drain electrode D3 and/or the second drain electrode D2 may be formed. On the additional passivation layer, a pixel electrode contacting the third drain electrode D3 and/or the second drain electrode D2 may be formed. Here, in convenience, we figure out and explain about the structure of the thin film transistor showing the main features of the present disclosure.

As mentioned above, the thin film transistor substrate for the flat panel display according to the first embodiment of the present disclosure suggests the structure in which the first thin film transistor T1 having the polycrystalline semiconductor material and the second thin film transistor T2 having the oxide semiconductor material, on the same one substrate SUB. Especially, the first source-drain electrodes S1 and D1 of the first thin film transistor T1 and the second gate electrode G2 of the second thin film transistor T2 are formed on the same layer with the same metal material.

Specially, for simplifying the manufacturing process, when forming the first source-drain electrode S1-D1 and the second gate electrode G2, the second gate insulating layer GI2 would be formed at the same time. As the results, the second gate insulating layer GI2 has the same shape with the metal layer including the first source-drain electrode S1-D1 and the second gate electrode G2 disposed thereon.

Further, in the thermal treatment process for the second semiconductor layer A2 including the oxide semiconductor material, the hydrogenation process for the first semiconductor layer A1 including the polycrystalline semiconductor material can be performed, at the same time. To do so, it is preferable that the intermediate insulating layer ILD includes two stacked layers as disposing an oxide layer SIO over a nitride layer SIN. In the view of manufacturing process, a hydrogenation is required for diffusing the hydrogen particles into the first semiconductor layer A1. Further, it is required for performing a thermal treatment for stabilizing the second semiconductor layer A2 including the oxide semiconductor material. The hydrogenation process may be performed after depositing the nitride layer SIN on the first semiconductor layer A1, and the thermal treatment may be performed after forming the second semiconductor layer A2.

According to the first embodiment of the present disclosure, as the oxide layer SIO is deposited between the nitride layer SIN and the second semiconductor layer A2, the hydrogen particles can be prevented from diffusing into the second semiconductor layer A2 including the oxide semiconductor material too much. Therefore, in this first embodiment of the present disclosure, during the thermal treatment for the oxide semiconductor material, the hydrogenation process may be performed at the same time.

Figure 2:
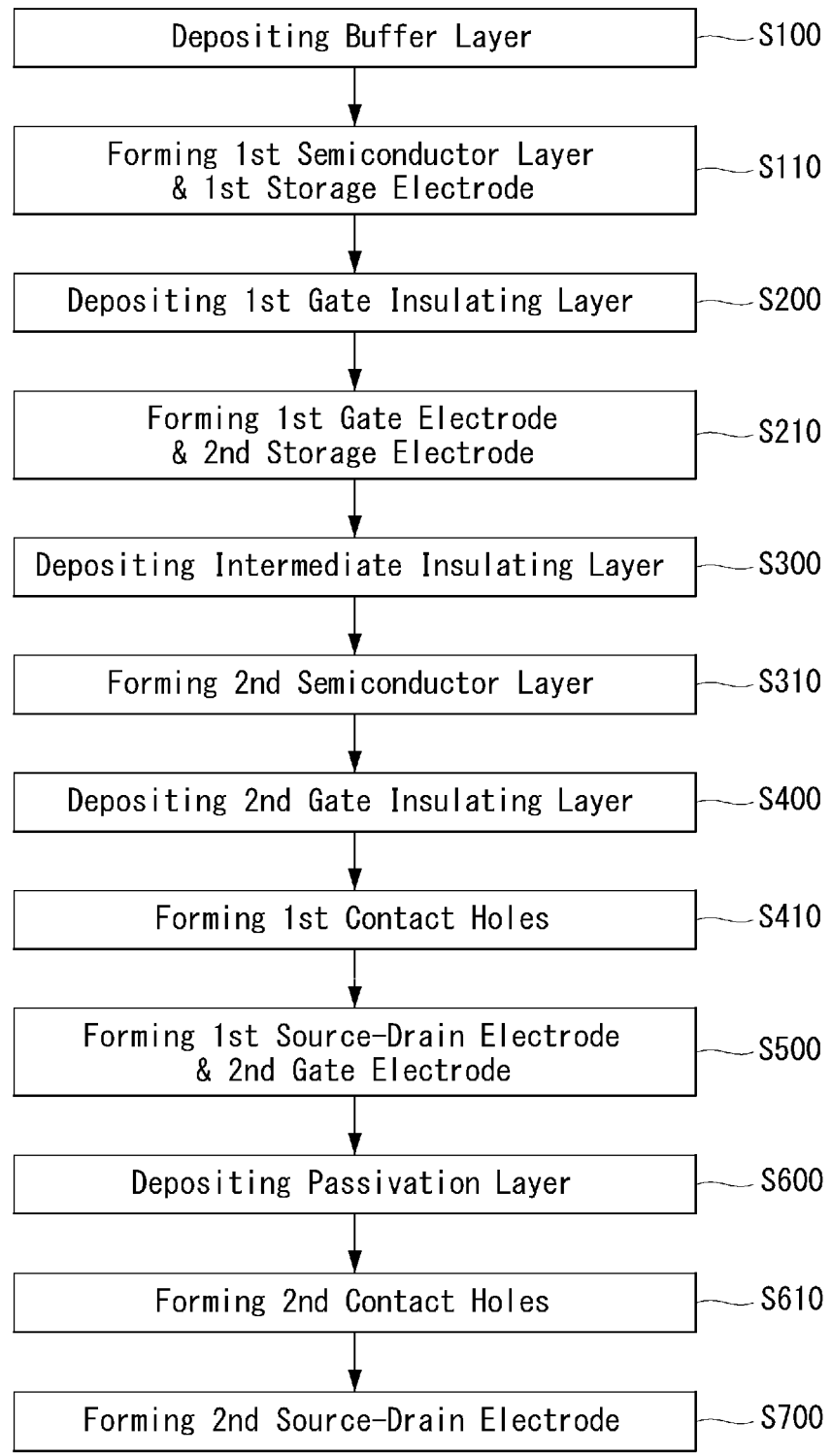
FIG. 2 is a flow chart illustrating a method for manufacturing the thin film transistor substrate for a flat panel display in which two different type thin film transistors are formed, according to the first embodiment of the present disclosure.

Hereinafter, referring to FIG. 2, we will explain about the manufacturing method for the thin film transistor substrate of the flat panel display including two different thin film transistors on the same substrate. FIG. 2 is a flow chart illustrating a method for manufacturing the thin film transistor substrate having two different type thin film transistors according to the first embodiment of the present disclosure.

In the step of S100, on a substrate SUB, a buffer layer BUF is deposited. Even though it is not shown in figures, before depositing the buffer layer BUF, a light shield layer may be formed at desired area.

In the step of S110, on the buffer layer BUF, an amorphous silicon (a-Si) material is deposited. Performing the crystallization process, the amorphous silicon layer is converted into the polycrystalline silicon (poly-Si). Using a first mask process, the polycrystalline silicon layer is patterned to form a first semiconductor layer A1 and a first storage electrode ST1.

In the step of S200, depositing an insulating material such as an silicon oxide on the whole surface of the substrate SUB having the first semiconductor layer A1 and the first storage electrode ST1, a first gate insulating layer GI1 is formed. The first gate insulating layer GI1 preferably includes the silicon oxide. Here, the first gate insulating layer GI1 preferably has the thickness of 1,000 Å or more and 1,500 Å or less.

In the step of S210, on the first gate insulating layer GI1, a gate metal material is deposited. Using a second mask process, the gate metal material is patterned to form a first gate electrode G1 and a second storage electrode ST2. The first gate electrode G1 is disposed as overlapping with the middle portion of the first semiconductor layer A1. The second storage electrode ST2 is disposed as overlapping with the first storage electrode ST1.

Using the first gate electrode G1 as a mask, impurity materials are doped into some portions of the first semiconductor layer A1 so that doping areas including a source area SA and a drain area DA may be defined. The detail manufacturing process for the doping areas may be little bit difference according to the types of thin film transistor, P-MOS type, N-MOS type and/or C-MOS type. For example of the N-MOS type, a high density doping area may be formed firstly, and then a low density doping area may be formed. Using the photo-resist pattern for the first gate electrode G1 which has wider size than the first gate electrode G1, the high density doping area can be defined. Removing the photo-resist pattern and using the first gate electrode G1 as a mask, the low density doping area (or, 'LDD') can be defined between the high density doping area and the first gate electrode G1. The impurity doping areas are not shown in figures, in convenience.

Otherwise, the doping area including the source area SA and the drain area DA may be defined at the step of S110. That is, just after forming the first semiconductor layer A1 and the first storage electrode ST1, the impurities may be dopped using the photoresist. In this case, it is preferable that the impurities are dopped into the first storage electrode ST1 to make it the conductive layer.

In the step of S300, on the whole surface of the substrate SUB having the first gate electrode G1 and the second storage electrode ST2, an intermediate insulating layer ILD is deposited. Especially, a nitride layer SIN is firstly deposited and then an oxide layer SIO is sequentially deposited thereon. The nitride layer SIN includes a lot of hydrogen particles during the depositing process. Considering the manufacturing process, the total thickness of the intermediate insulating layer ILD may have a thickness of 2,000 Å~6,000 Å. Here, for the nitride layer SIN of which purpose is the diffusion of the hydrogen particles, considering the hydrogenation efficiency, it preferably has the thickness of 1,000 Å~3,000 Å. As the oxide layer SIO is for preventing the hydrogen particle from diffusing too much into the semiconductor layer disposed over the oxide layer SIO, it preferably has the thickness of 1,000 Å~3,000 Å. Considering the hydrogen diffusion efficiency and the element properties, the thicknesses of the oxide layer SIO and the nitride layer SIN may preferably be selected and/or decided. For example, in order that prevent the hydrogen particles from diffusing out too much, the nitride layer SIN is preferably thinner than the oxide layer SIO.

In the step of S310, on the intermediate insulating layer ILD, especially on the oxide layer SIO, an oxide semiconductor material is deposited. Further, the oxide semiconductor material is preferably deposited directly on the oxide layer SIO in order that the oxide semiconductor material is not directly contact the nitride layer SIN including the hydrogen particles a lot. The oxide semiconductor material includes at least one of the Indium Gallium Zinc Oxide (or 'IGZO), the Indium Gallium Oxide (or 'IGO'), and the Indium Zinc Oxide (or 'IZO). Using a third mask process, the oxide semiconductor material is patterned to form a second semiconductor layer A2. The second semiconductor layer A2 is disposed where a second thin film transistor T2 would be formed.

In the step of S310, performing a post-thermal process to the substrate SUB having the second semiconductor layer A2, the hydrogenation for the first semiconductor layer A1 including the polycrystalline silicon and the thermal treatment for the second semiconductor layer A2 including the oxide semiconductor material are performed at the same time. The post-thermal process may be performed under 350~380° C. temperature condition. At this time, a large amount of the hydrogen particles included into the nitride layer SIN would be diffused into the first semiconductor layer A1. However, the amount of the hydrogen particles diffused into the second semiconductor layer A2 may be restricted and/or controlled by the oxide layer SIO.

In the step of S400, on the whole surface of the substrate SUB having the second semiconductor layer A2, a second gate insulating layer GI2 is deposited. It is preferable that the second gate insulating layer GI2 is made of oxide layer such as the silicon oxide (SiOx).

In the step of S410, using a fourth mask process, the second gate insulating layer GI2, the intermediate insulating layer ILD and the first gate insulating layer GI1 are patterned to form a first source contact hole SH1 exposing the one portion of the first semiconductor layer A1, and a first drain contact hole DH1 exposing the other portion of the first semiconductor layer A1. These contact holes SH1 and DH1 are for connecting the first source-drain electrodes to the first semiconductor layer A1, later.

In the step of S500, a source-drain metal material is deposited on the intermediate layer ILD having the first source contact hole SH1 and the first drain contact hole DH1. Using a fifth mask process, the source-drain metal material and the second gate insulating layer GI2 disposed thereunder are patterned to form a first source electrode S1, a first drain electrode D1 and a second gate electrode G2. The first source electrode S1 contacts the one area of the first semiconductor layer A1 through the first source contact hole SH1. The first drain electrode D1 contacts the other area of the first semiconductor layer A1 through the first drain contact hole DH1. The second gate electrode G2 is overlapped with the middle portions of the second semiconductor layer A2, the channel area.

In the step of S600, on the whole surface of the substrate SUB having the first source-drain electrodes S1-D1 and the second gate electrode G2, a passivation layer PAS is deposited.

In the step of S610, patterning the passivation layer PAS using a sixth mask process, second contact holes are formed. In this process, third contact holes are formed at the same time. The second contact holes include a second source contact hole SH2 and a second drain contact hole DH2 exposing a second source area SA2 and a second drain area DA2, respectively. The second source area SA2 and the second drain area DA2 are the one side and the other side, respectively. The third contact holes include a third source contact hole SH3 and a third drain contact hole DH3 exposing the first source electrode S1 and the first drain electrode D1, respectively.

In the step of S700, on the passivation layer PAS having the second contact holes and the third contact holes, a conductive material is deposited. Patterning the conductive material using a seventh mask process, a second source-drain electrode S2-D2 is formed. The second source electrode S2 contacts the second source area SA2 through the second source contact hole SH2. The second drain electrode D2 contacts the second drain area DA2 through the second drain contact hole DH2. At the same time, a third source-drain electrode S3-D3 is formed. The third source electrode S3 contacts the first source electrode S1 through the third source contact hole SH3. The third drain electrode D3 contacts the first drain electrode D1 through the third drain contact hole DH3.

The intermediate insulating layer ILD according to the first embodiment of the present disclosure is formed under the relatively high temperature environment. In the case that the first source-drain electrode S1-D1 is formed and then the intermediate insulating layer ILD is deposited, the thermal energy generated at the process for forming the intermediate insulating layer ILD may transferred to the first source area SA1 and the first drain area DA1 of the first semiconductor layer A1 via the first source-drain electrode S1-D1. By this heat or thermal effect, the first semiconductor layer A1 may be degraded.

However, in the manufacturing process according to the first embodiment of the present disclosure, the process step S300 for depositing the intermediate insulating layer ILD is performed before the step S500 for forming the first source-drain electrode S1-D1 contacting the first semiconductor layer A1 of the first thin film transistor T1. Therefore, at the high temperature process for forming the intermediate insulating layer ILD, the first semiconductor layer A1 would not be degraded.

Second Embodiment

Figure 3:
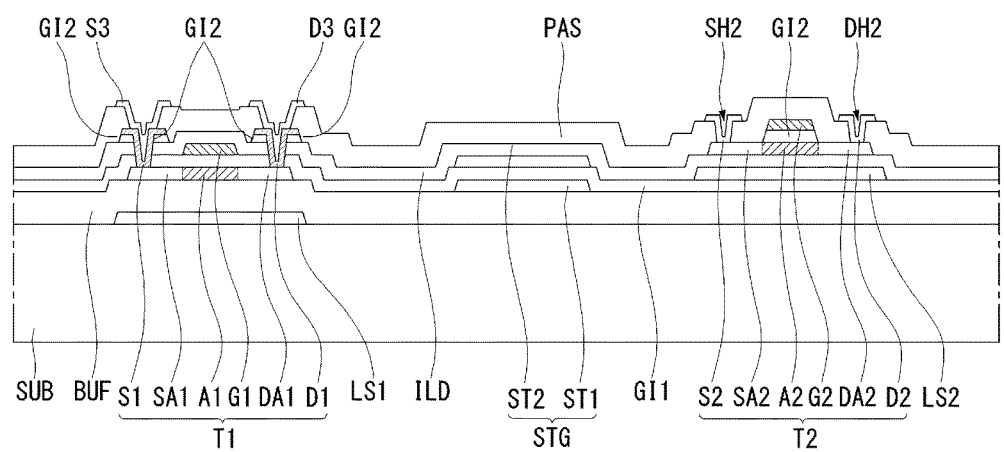
FIG. 3 is a cross sectional view illustrating a structure of a thin film transistor substrate for a flat panel display in which two different type thin film transistors are formed, according to the second embodiment of the present disclosure.

Hereinafter, referring to FIG. 3, we will explain about the second embodiment of the present disclosure. FIG. 3 is a cross sectional view illustrating a structure of a thin film transistor substrate for a flat panel display in which two different type thin film transistors are formed, according to the second embodiment of the present disclosure.

The thin film transistor substrate according to the second embodiment is basically very similar with that of the first embodiment. The main difference is on a first light shielding layer LS1 for preventing the lights from the outside of the bottom side of the first thin film transistor T1. Further, under the second thin film transistor T2, a second light shielding layer LS2 may be further included for preventing the light incident from outside.

The first light shielding layer LS1 may be formed by separated mask process, under the buffer layer BUF. The second light shielding layer LS2 may be formed of the same material and at the same layer with the first gate electrode G1, under the second thin film transistor T2. Otherwise, even though not shown in figures, the second light shielding layer LS2 may be formed of the same material and at the same layer with the first light shielding layer LS1, under the second thin film transistor T2.

Figure 4:
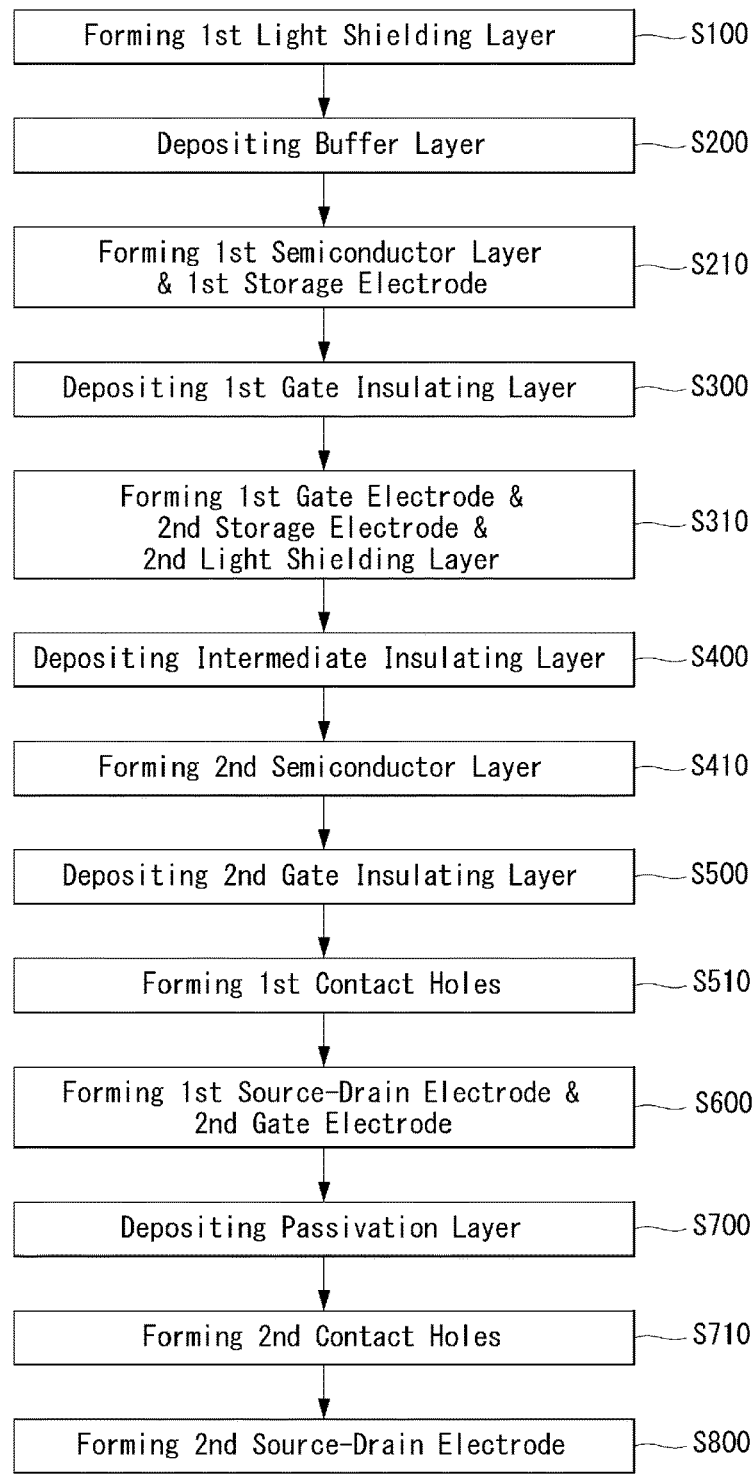
FIG. 4 is a flow chart illustrating a method for manufacturing the thin film transistor substrate for a flat panel display in which two different type thin film transistors are formed, according to the second embodiment of the present disclosure.

Other elements are same with those of the first embodiment, so same explanation would not be duplicated. Hereinafter, we will explain about the manufacturing process for the thin film transistor substrate for a flat panel display according to the second embodiment of the present disclosure. FIG. 4 is a flow chart illustrating a method for manufacturing the thin film transistor substrate for a flat panel display in which two different type thin film transistors are formed, according to the second embodiment of the present disclosure.

In the step of S100, on a substrate SUB, a light shielding material is deposited. The light shielding material may include an opaque metal material, a black resin material or an amorphous silicon material. Patterning the light shielding material using a first mask process, a first light shielding layer LS1 is formed under the first thin film transistor T1. The first light shielding layer LS1 is disposed as enclosing or overlapping the whole area of the first semiconductor layer A1.

In the step of S200, on the whole surface of the substrate SUB including the first light shielding layer LS1, a buffer layer BUF is deposited.

In the step of S210, on the buffer layer BUF, an amorphous silicon (a-Si) material is deposited. Performing the crystallization process, the amorphous silicon material is converted into the polycrystalline silicon (poly-Si) material. Using a second mask process, the polycrystalline silicon material is patterned to form a first semiconductor layer A1 and a first storage electrode ST1.

In the step of S300, depositing an insulating material such as a silicon oxide on the whole surface of the substrate SUB having the first semiconductor layer A1 and the first storage electrode ST1, a first gate insulating layer GI1 is formed. The first gate insulating layer GI1 is preferably made of the silicon oxide with a thickness of 1,000 Å~1,500 Å.

In the step of S310, on the first gate insulating layer GI1, a gate metal layer is deposited. Using a third mask process, the gate metal layer is patterned to form a first gate electrode G1, a second storage electrode ST2 and a second light shielding layer LS2. The first gate electrode G1 is disposed as overlapping with the middle portion of the first semiconductor layer A1. The second storage electrode ST2 is disposed as overlapping with the first storage electrode ST1. The second light shielding layer LS2 is disposed where the second thin film transistor T2 would be formed.

In the step of S400, on the whole surface of the substrate SUB having the first gate electrode G1, the second storage electrode ST2 and the second light shielding layer LS2, an intermediate insulating layer ILD is deposited. When forming the insulating layer ILD of the double layer structure, the nitride layer SIN is firstly deposited and then the oxide layer SIO is sequentially deposited on the nitride layer SIN.

In the step of S410, on the intermediate insulating layer ILD, specially on the oxide layer SIO, an oxide semiconductor material is deposited. The oxide semiconductor material includes the indium gallium zinc oxide (IGZO), the indium gallium oxide (IGO) or the indium zinc oxide (IZO). Patterning the oxide semiconductor material using a fourth mask process, a second semiconductor layer A2 is formed. The second semiconductor layer A2 is disposed where a second thin film transistor T2 would be formed. In detail, it is preferable that the second semiconductor layer A2 is located as overlapping with the second light shielding layer LS2.

In the step of S500, on the whole surface of the substrate SUB having the second semiconductor layer A2, a second gate insulating layer GI2 is deposited. It is preferable that the second gate insulating layer GI2 is made of the oxide layer including an oxide silicon material SiOx).

In the step of S510, patterning the second gate insulating layer GI2, the intermediate insulating layer ILD and the first gate insulating layer GI1 using a fifth mask process, first contact holes are formed. The first contact holes include a first source contact hole SH1 exposing the one side of the first semiconductor layer A1, and a first drain contact hole DH1 exposing the other side of the first semiconductor layer A1. The first contact holes are for connecting a first source-drain electrode S1-D1 to the first semiconductor layer A1.

In the step of S600, on the intermediate insulating layer ILD having the first source contact hole SH1 and the first drain contact hole DH1, a source-drain metal is deposited. Patterning the source-drain metal and the second gate insulating layer GI2 using a sixth mask process, a first source electrode S1, a first drain electrode D1 and a second gate electrode G2. The first source electrode S1 contacts the one side of the first semiconductor layer A1 through the first source contact hole SH1. The first drain electrode D1 contacts the other side of the first semiconductor layer A1 through the first drain contact hole DH1. The second gate electrode G2 is disposed as overlapping with the middle portions of the second semiconductor layer A2, the channel layer of the second semiconductor layer A2.

In the step of S700, a passivation layer PAS is deposited on the whole surface of the substrate SUB.

In the step of S710, patterning the passivation layer PAS using a seventh mask process, second contact holes are formed. Further, third contact holes are also formed. The second contact holes include a second source contact hole SH2 and a second drain contact hole DH2. The second source contact hole SH2 exposes the second source area SA2 which is the one side of the second semiconductor layer A2. The second drain contact hole DH2 exposes the second drain area DA2 which is the other side of the second semiconductor layer A2. The third contact holes include a third source contact hole SH3 and a third drain contact hole DH3 exposing the first source electrode S1 and the first drain electrode D1, respectively.

In the step of S800, a conductive material is deposited on the passivation layer PAS having the second contact holes and the third contact holes. Patterning the conductive material using a eighth mask process, a second source-drain electrode S2-D2. The second source electrode S2 contacts the second source area SA2 through the second source contact hole SH2. The second drain electrode D2 contacts the second drain area DA2 through the second drain contact hole DH2. At the same time, a third source-drain electrode S3-D3 is further formed. The third source electrode S3 contacts the first source electrode S1 through the third source contact hole SH3. The third drain electrode D3 contacts the first drain electrode D1 through the third drain contact hole DH3.

In the manufacturing process according to the second embodiment of the present disclosure, the process step S400 for depositing the intermediate insulating layer ILD is performed before the step S600 for forming the first source-drain electrode S1-D1 contacting the first semiconductor layer A1 of the first thin film transistor T1. Therefore, at the high temperature process for forming the intermediate insulating layer ILD, the first semiconductor layer A1 would not be degraded.

First Application Example

Figure 5:
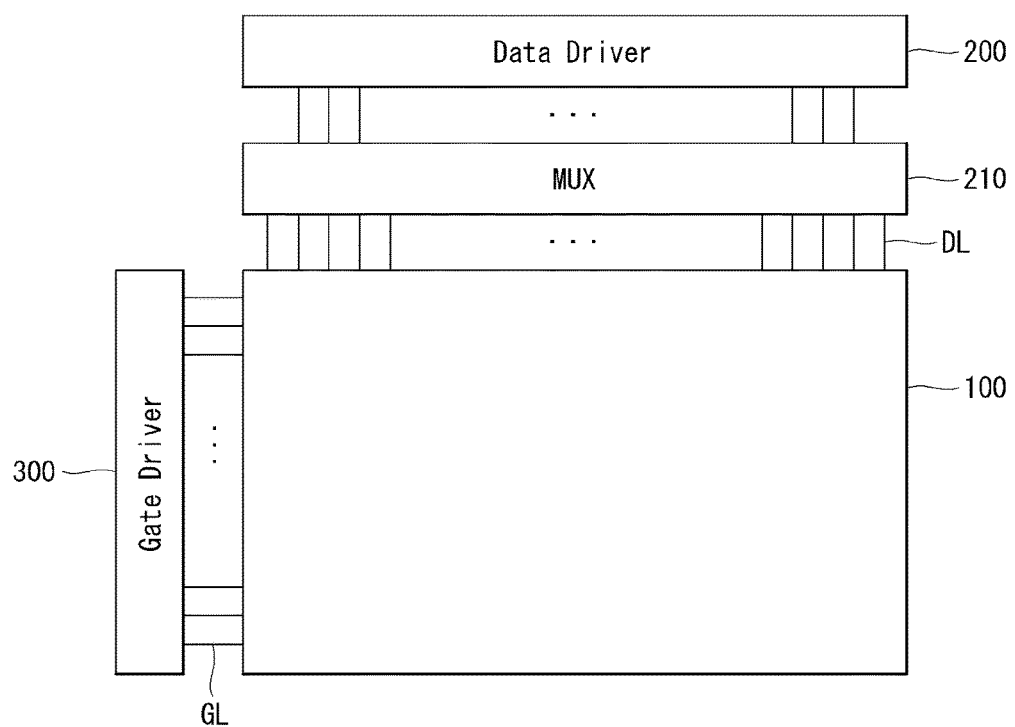
FIG. 5 is a block diagram illustrating a structure of the display according to a first application example of the present disclosure.

The thin film transistor substrate having two different type thin film transistors on the same substrate, above explained, can be applied to various type display including the flat panel display, the flexible display and/or the curved display. Forming the different two type thin film transistors on the same substrate, we can get various merits. Hereinafter, referring to FIG. 5, we will explain how many advanced features and merits can be expected from the thin film transistor substrate according to a first application example of the present disclosure. FIG. 5 is a block diagram illustrating a structure of the display according to a first application example of the present disclosure.

The first and the second transistors T1 and T2 would be formed in each pixel of the display panel 100 for switching the data voltage applied to the pixel or for driving the pixel. For the case of organic light emitting diode display, the second thin film transistor T2 may be a switch element for the pixel, and the first thin film transistor T1 may be a driver element. In the interim, by combining the first and the second thin film transistors T1 and T2, they may be applied to one switch element or one driver element.

For mobile device or wearable device, in order to reduce the power consumption, the lower speed driving method using low frame rate is adopted. In this case, the frame frequency may be lowered for still image and/or the images having slower update interval. Here, when using the lower frame rate, at every time for changing the data voltage, the brightness of the display may be flashed. In some cases, as the discharging time interval is elongated, the brightness may be flickered at every data update period. By applying the first and the second thin film transistors T1 and T2 according to the present disclosure, the flicker problem at lower speed driving method can be prevented.

In the lower speed driving method, as the data update period is elongated, the leaked current amount of the switching thin film transistor may be increased. The leaked current of the switching thin film transistor may cause the voltage drop down of the storage capacitance and the drop down of the voltage between gate and source. The second thin film transistor having the oxide semiconductor material can be applied to the switch thin film transistor of the organic light emitting diode display. As the thin film transistor including the oxide semiconductor material has the lower off-current characteristics, the voltage drop down of the storage capacitance and/or of the gate electrode of the driving thin film transistor. The flicker phenomenon is not occurred when using the lower speed driving method.

As the polycrystalline silicon has the characteristics of high mobility, by applying the first thin film transistor to the driving thin film transistor of the organic light emitting diode display, the current amount supplied to the organic light emitting diode can be enlarged. Therefore, applying the second thin film transistor T2 to the switching thin film transistor and the first thin film transistor T1 to the driving thin film transistor, we can get the organic light emitting diode display having lower power consumption and better video quality.

As the thin film transistor substrate according to the present disclosure has excellent video quality without flickers even though the lower speed driving method is applied, it has a merit of very suitable for applying to the mobile display or the wearable display. For example of wearable wrist watch, the video data may be updated at every one second for reducing the power consumption. In that case, the frame frequency is 1 Hz. Using the present disclosure, we can get excellent video quality without any flickers even though the video data is driven with lower frequency such as 1 Hz or less. Further, for the mobile display or the wearable display, the frame rate for the still image can be remarkably lowered, so that the power consumption can be saved without any degrade of the video quality. As the result, the video quality of the mobile display and/or wearable display, and the life time of the battery can be elongated. In addition, the present disclosure can be applied to the electric book device (or 'E-Book') of which data update period is very long, without any degrade of the video quality.

At least one of the first and the second thin film transistors T1 and T2 may be embedded into a driver IC, for example shown in FIG. 5, any one of the data driver IC 200, the multiplexer (or 'MUX') 210, and the gate driver IC 300, for forming a driver IC. This driver IC writes and/or applies the data voltage to the pixel. In other case, any one of the first and the second thin film transistors T1 and T2 is disposed within the pixel, and other is disposed in the driver IC. The data driver IC 200 converts the input video data into the voltage values and output the voltage values. The multiplexer 210 may reduce the number of the output channel of the data driver 200, by distributing the data voltages from the data driver 200 to the data lines DL by time-sharing or time-division method. The gate driver IC 300 outputs the scan signal (or 'gate signal') to the gate line GL synchronized to the data voltage for sequentially selecting the pixel line where the data voltage is applied. In order to reduce the output channel number of the gate driver IC 300, other multiplexers not shown in the figures may be further included between the gate driver IC 300 and the gate line GL. The multiplexer 210 and the gate driver IC 300 may be formed on the same thin film transistor substrate with the pixel array, as shown in FIG. 5. The multiplexer 210 and the gate driver IC 300 may be disposed within the non-display area NA and the pixel array may be disposed within the display area AA, as shown in FIG. 5.

The thin film transistor substrate according to the present disclosure may be applied to any type of active type display requiring the active matrix thin film transistor substrate such as the liquid crystal display, the organic light emitting diode display and/or the electrophoresis display device. Hereinafter, we will explain about more application examples for the display using the thin film transistor substrate according to the present disclosure.

Second Application Example

Figure 6:
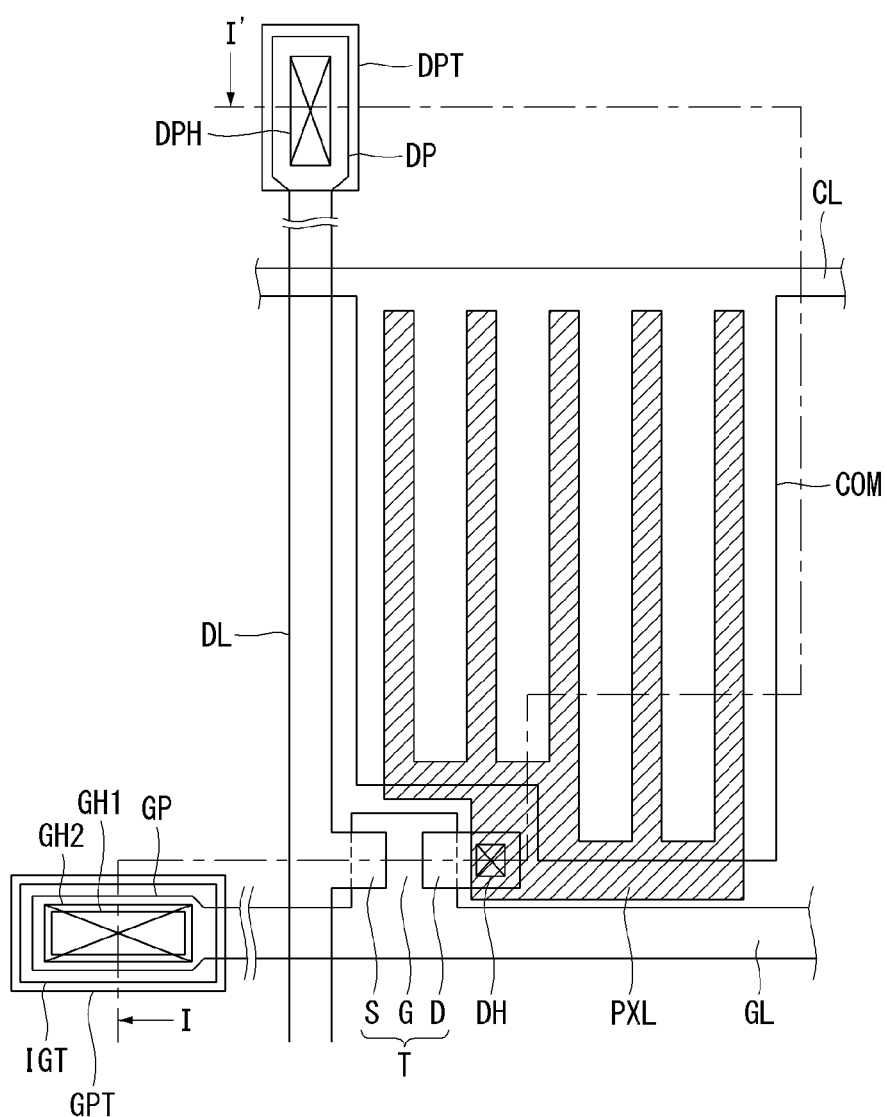
FIG. 6 is a plane view illustrating a thin film transistor substrate having an oxide semiconductor layer included in a fringe field type liquid crystal display according to a second application example of the present disclosure.
Figure 7:
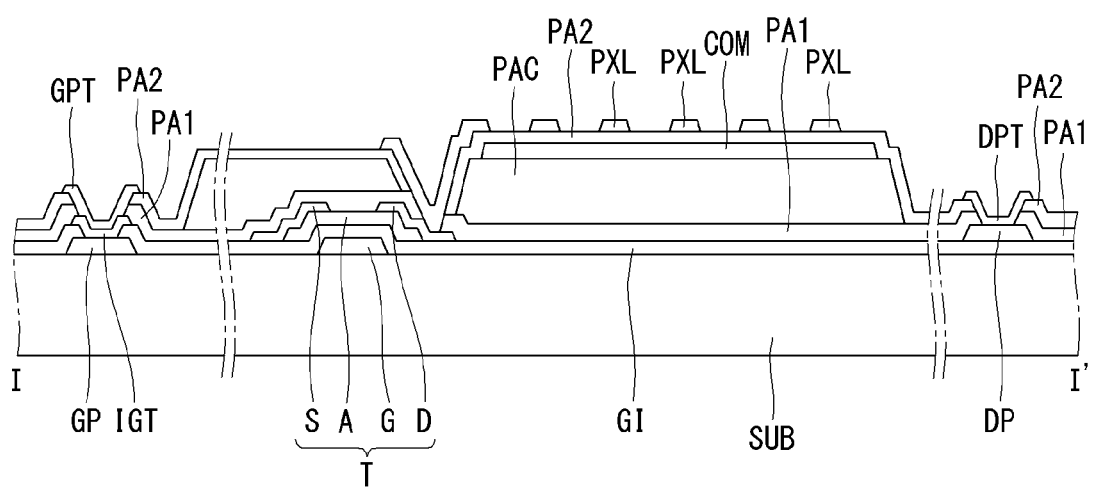
FIG. 7 is a cross-sectional view illustrating the structure of the thin film transistor substrate of FIG. 6 by cutting along the line I-I' according to the second application example of the present disclosure.

FIG. 6 is a plane view illustrating a thin film transistor substrate having an oxide semiconductor layer included in a fringe field type liquid crystal display according to a second application example of the present disclosure. FIG. 7 is a cross-sectional view illustrating the structure of the thin film transistor substrate of FIG. 6 by cutting along the line I-I' according to the second application example of the present disclosure.

The thin film transistor substrate having a metal oxide semiconductor layer shown in FIGS. 6 and 7 comprises a gate line GL and a data line DL crossing each other with a gate insulating layer GI there-between on a lower substrate SUB, and a thin film transistor T formed at each crossing portion. By the crossing structure of the gate line GL and the data line DL, a pixel area is defined.

The thin film transistor T comprises a gate electrode G branched (or 'extruded') from the gate line GL, a source electrode S branched from the data line DL, a drain electrode D facing the source electrode S, and a semiconductor layer A overlapping with the gate electrode G on the gate insulating layer GI for forming a channel area between the source electrode S and the drain electrode D.

At one end of the gate line GL, a gate pad GP is disposed for receiving the gate signal. The gate pad GP is connected to a gate pad intermediate terminal IGT through the first gate pad contact hole GH1 penetrating the gate insulating layer GI. The gate pad intermediate terminal IGT is connected to the gate pad terminal GPT through the second gate pad contact hole GH2 penetrating the first passivation layer PA1 and the second passivation layer PA2. Further, at one end of the data line DL, a data pad DP is disposed for receiving the pixel signal. The data pad DP is connected to a data pad terminal DPT through the data pad contact hole DPH penetrating the first passivation layer PA1 and the second passivation layer PA2.

In the pixel area, a pixel electrode PXL and a common electrode COM are formed with the second passivation layer PA2 there-between, to form a fringe electric field. The common electrode COM is connected to the common line CL disposed in parallel with the gate line GL. The common electrode COM is supplied with a reference voltage (or "common voltage") via the common line CL. For other cases, the common electrode COM has the one sheet electrode shape which covers the whole surface of the substrate SUB except the drain contact hole DH portions. That is, covering over the data line DL, the common electrode COM can work as a shielding means for the data line DL.

The common electrode COM and the pixel electrode PXL can have various shapes and positions according to the design purpose and environment. While the common electrode COM is supplied with a reference voltage having constant value, the pixel electrode PXL is supplied with a data voltage varying timely according to the video data. Therefore, between the data line DL and the pixel electrode PXL, a parasitic capacitance may be formed. Due to the parasitic capacitance, the video quality of the display may be degraded. Therefore, it is preferable that the common electrode COM is disposed at the lower layer and the pixel electrode PXL is disposed at the topmost layer.

In other words, on the first passivation layer PA1 covering the data line DL and the thin film transistor T, a planarization layer PAC is stacked thereon by thickly depositing an organic material having a low permittivity. Then, the common electrode COM is formed. And then, after depositing the second passivation layer PA2 to cover the common electrode COM, the pixel electrode PXL overlapping with the common electrode is formed on the second passivation layer PA2. In this structure, the pixel electrode PXL is far from the data line DL by the first passivation layer PA1, the planarization layer PAC and the second passivation layer PA2, so that it is possible to reduce the parasitic capacitance between the data line DL and the pixel electrode PXL. In other case, the pixel electrode PXL may be disposed at the lower layer and the common electrode COM is disposed at the topmost layer.

The common electrode COM may have a rectangular shape corresponding to the pixel area. The pixel electrode PXL may have the shape of a plurality of segments. Especially, the pixel electrode PXL is vertically overlapped with the common electrode COM with the second passivation layer PA2 there-between. Between the pixel electrode PXL and the common electrode COM, the fringe electric field is formed. By this fringe electric field, the liquid crystal molecules arrayed in plane direction between the thin film transistor substrate and the color filter substrate may be rotated according to the dielectric anisotropy of the liquid crystal molecules. According to the rotation degree of the liquid crystal molecules, the light transmittance ratio of the pixel area may be changed so as to represent desired gray scale.

In FIGS. 6 and 7 for explaining the second application example of the present disclosure, in convenience, the thin film transistor T of the liquid crystal display is shown briefly. The first and/or the second thin film transistors T1 and/or T2 explained from the first to third embodiments of the present disclosure can be applied to this thin film transistor. For example, requiring a low speed driving, the second thin film transistor T2 having the oxide semiconductor material can be applied to the thin film transistor T. For another example, requiring a low power consumption, the first thin film transistor T1 having the polycrystalline semiconductor material may be applied to the thin film transistor T. For still other example, the thin film transistor T may be formed as including the first and the second thin film transistors T1 and T2 and they are connected so that the performance and the characteristics of them can be compensated each other.

Third Application Example

Figure 8:
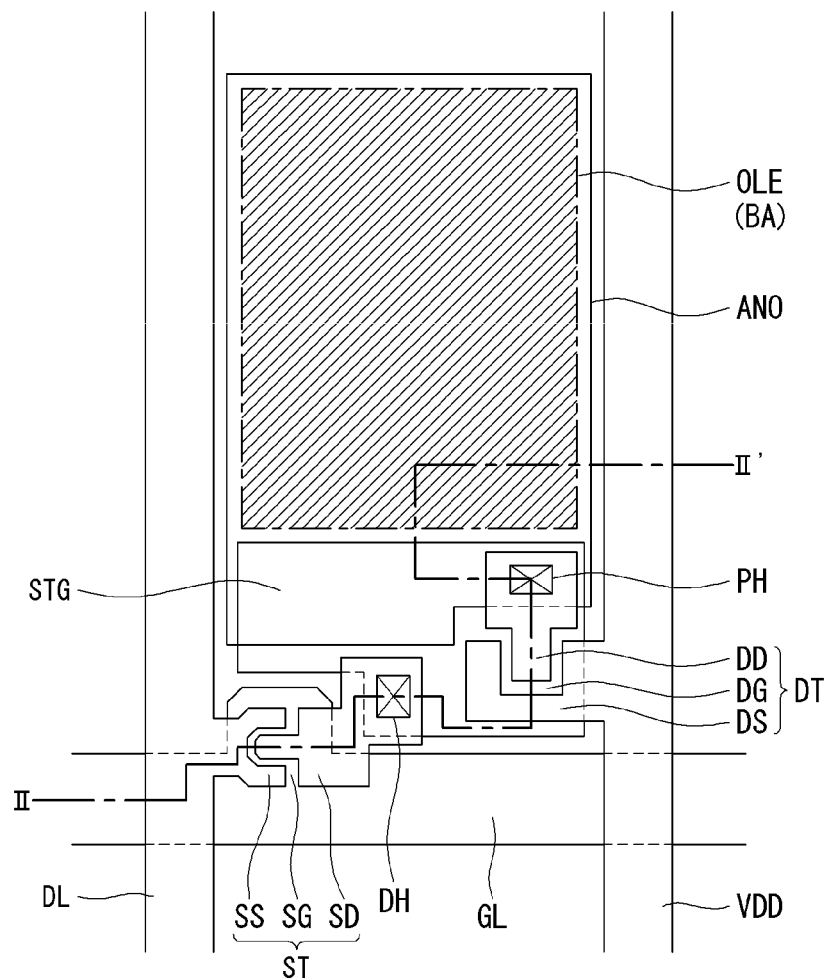
FIG. 8 is a plane view illustrating the structure of one pixel for the active matrix type organic light emitting diode display having the active switching elements such as the thin film transistors according to a third application embodiment of the present disclosure.
Figure 9:
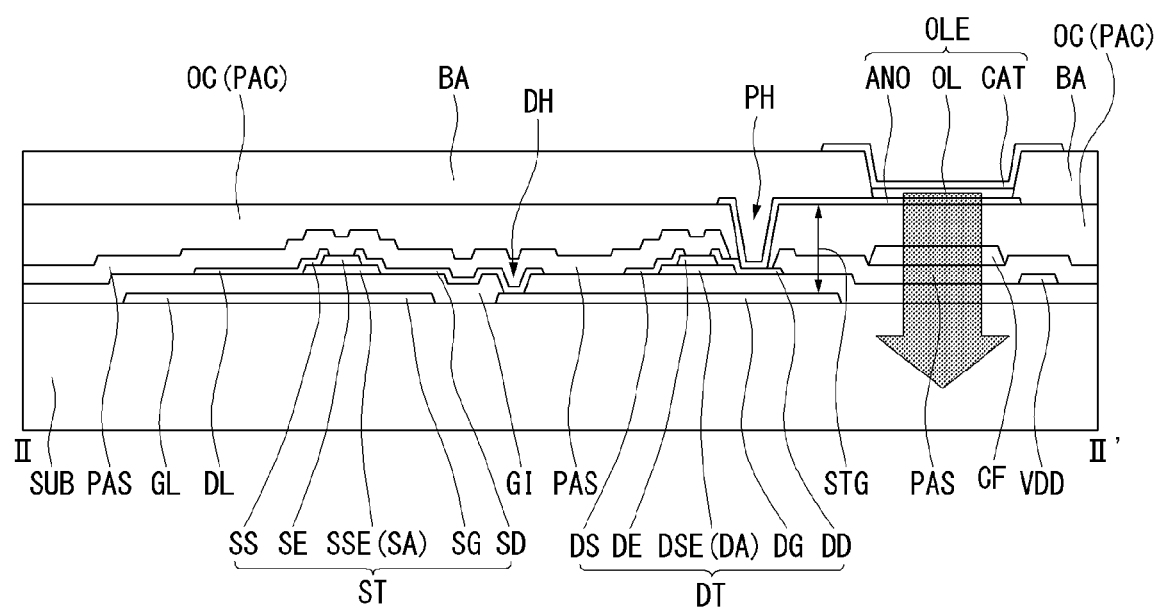
FIG. 9 is a cross sectional view illustrating the structure of the organic light emitting diode display along to the cutting line of II-II' in FIG. 8 according to the third application embodiment of the present disclosure.

FIG. 8 is a plane view illustrating the structure of one pixel for the active matrix type organic light emitting diode display having the active switching elements such as the thin film transistors according to a third application example of the present disclosure. FIG. 9 is a cross sectional view illustrating the structure of the organic light emitting diode display along to the cutting line of II-II' in FIG. 8 according to the third application example of the present disclosure.

Referring to FIGS. 8 and 9, the active matrix type organic light emitting diode display comprises a switching thin film transistor ST, a driving thin film transistor DT connected to the switching thin film transistor ST, and an organic light emitting diode OLE connected to the driving thin film transistor DT.

The switching thin film transistor ST is formed where a gate line GL and a data line DL are crossing each other, on a substrate SUB. Supplying the data voltage from the data line DL to the gate electrode DG of the driving thin film transistor DT and to the storage capacitance STG replying the scan signal, the switching thin film transistor ST acts for selecting the pixel which is connected to the switching thin film transistor ST. The switching thin film transistor ST includes a gate electrode SG branching from the gate line GL, a semiconductor channel layer SA overlapping with the gate electrode SG, a source electrode SS and a drain electrode SD. Controlling the amount of the current applied to the organic light emitting diode OLE of the pixel according to the gate voltage, the driving thin film transistor DT acts for driving the organic light emitting diode OLE disposed at the pixel selected by the switching thin film transistor ST.

The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLE. Between the anode electrode ANO and the cathode electrode CAT, an organic light emitting layer OL is disposed. The cathode electrode CAT is connected to the ground line Vss.

Referring to FIG. 9 more detail, on the substrate SUB of the active matrix organic light emitting diode display, the gate electrodes SG and DG of the switching thin film transistor ST and the driving thin film transistor DT, respectively are disposed. On the gate electrodes SG and DG, the gate insulator GI is deposited. On the gate insulator GI overlapping with the gate electrodes SG and DG, the semiconductor layers SA and DA are disposed, respectively. On the semiconductor layer SA and DA, the source electrodes SS and DS and the drain electrodes SD and DD facing and separating from each other, respectively, are disposed. The drain electrode SD of the switching thin film transistor ST is connected to the gate electrode DG of the driving thin film transistor DT via the drain contact hole DH penetrating the gate insulator GI. The passivation layer PAS is deposited on the substrate SUB having the switching thin film transistor ST and the driving thin film transistor DT.

A color filer CF is disposed at the area where the anode electrode ANO is disposed. It is preferable for the color filter CF to have a large area as possible. For example, it is preferable to overlap with some portions of the data line DL, the driving current line VDD and/or the gate line GL. The upper surface of the substrate having these thin film transistors ST and DT and color filters CF is not in even and/or smooth conditions, but in uneven and/or rugged conditions having many steps. In order that the organic light emitting diode display has good luminescent quality over the whole display area, the organic light emitting layer OL should have an even or smooth surface. So, to make the upper surface in planar and even conditions, the planar layer PAC or the over coat layer OC is deposited on the whole surface of the substrate SUB.

Then, on the over coat layer OC, the anode electrode ANO of the organic light emitting diode OLED is disposed. Here, the anode electrode ANO is connected to the drain electrode DD of the driving thin film transistor DT through the pixel contact hole PH penetrating the over coat layer OC and the passivation layer PAS.

On the substrate SUB having the anode electrode ANO, a bank (or 'bank pattern') BA is disposed over the area having the switching thin film transistor ST, the driving thin film transistor DT and the various lines DL, GL and VDD, for defining the pixel area. The exposed portion of the anode electrode ANO by the bank BA would be the light emitting area. On the anode electrode ANO exposed from the bank BA, the organic light emitting layer OL is deposited. On the organic light emitting layer OL, the cathode electrode ACT is deposited. For the case that the organic light emitting layer OL has a material emitting the white lights, each pixel can represent various colors by the color filter CF disposed under the anode electrode ANO. The organic light emitting diode display as shown in FIG. 9 is the bottom emission type display in which the visible light is radiated to the bottom direction of the display substrate.

Between the gate electrode DG of the driving thin film transistor DT and the anode electrode ANO, a storage capacitance STG may be formed. By connected to the driving thin film transistor DT, the storage capacitance STG keeps the voltage supplied to the gate electrode DG of the driving thin film transistor DT from the switching thin film transistor ST in stable condition.

Using the thin film transistor substrate like the above explanations, an active type flat panel display having good properties can be acquired. Especially, to ensure excellent driving properties, it is preferable that the active layer of the thin film transistor would include a metal oxide semiconductor material.

The metal oxide semiconductor material may be degraded when it is working exposed by the lights for a long time. Therefore, it is preferable that the thin film transistor having a metal oxide semiconductor material has a structure for blocking the lights from outsides of the upper portion and/or the lower portion of the thin film transistor. For example, for the above mentioned thin film transistor substrates, it is preferable that the thin film transistor would be formed in the bottom gate structure. That is, the light induced from the outside of substrate, especially from the lower side of the substrate which facing to the observer, can be blocked by the gate electrode G including an opaque metal material.

The thin film transistor substrate for the flat panel display has a plurality of pixel area disposed in a matrix manner. Further, each pixel area includes at least one thin film transistor. That is, over the whole substrate, a plurality of thin film transistor is disposed. The plurality of pixel area and the plurality of thin film transistor are used for the same purpose and they should have the same quality and characteristics, so that they have the same structure.

However, in some cases, the thin film transistors may be formed as having different characteristics from each other. For example of the organic light emitting diode display, in one pixel area, at least one switching thin film transistor ST and at least one driving thin film transistor DT are disposed. As the purposes of the switching thin film transistor ST and the driving thin film transistor DT are different each other, the required characteristics of them are different each other, either. To do so, the switch thin film transistor ST and the driving thin film transistor DT may have the same structure and the same semiconductor material, but the channel layers of them have the different sizes for optimizing to the characteristics of them. Otherwise, compensating thin film transistor may further be included for supporting any specific functions or properties of any thin film transistor.

In FIGS. 8 and 9 for explaining the third application example of the present disclosure, in convenience, the switching thin film transistor ST and the driving thin film transistor DT of the organic light emitting diode display are shown briefly. The first and/or the second thin film transistors T1 and/or T2 explained from the first to second embodiments of the present disclosure can be applied to this thin film transistor. For example, the second thin film transistor T2 having the oxide semiconductor material can be applied for the switching thin film transistor ST. The first thin film transistor T1 having the polycrystalline semiconductor material may be applied for the driving thin film transistor DT. Therefore, as including the first and the second thin film transistors T1 and T2 on one substrate, the performance and the characteristics of them can be compensated each other.

Fourth Application Example

For still another example, a driver element (or 'driver IC') may be formed in the non-display area of the same thin film transistor substrate for the flat panel display. Hereinafter, referring to FIGS. 10 and 11, we will explain about the thin film transistor substrate having the driver IC on the same substrate.

Figure 10:
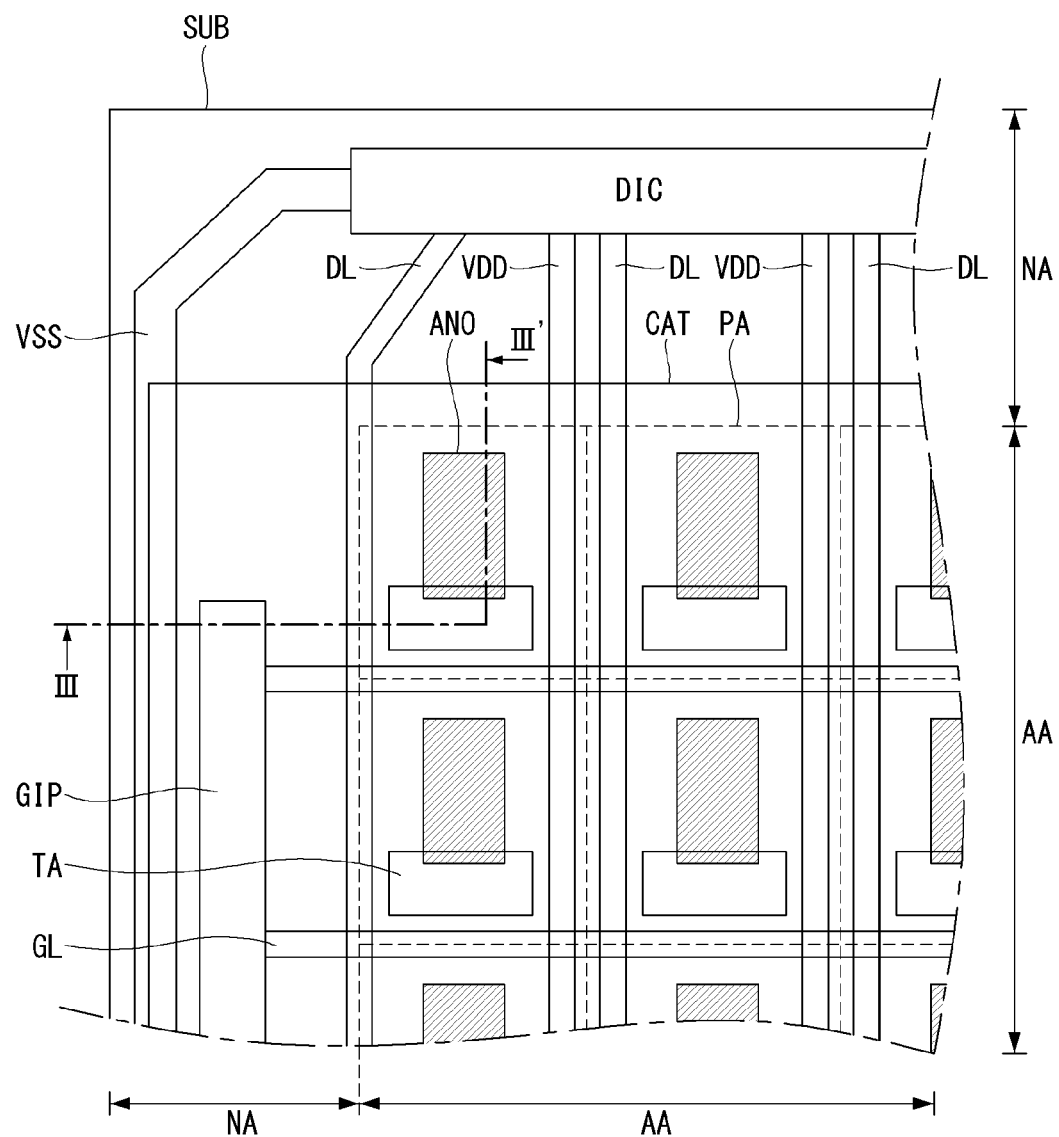
FIG. 10 is an enlarged plane view illustrating a structure of an organic light emitting diode display according to a fourth application embodiment of the present disclosure.
Figure 11:
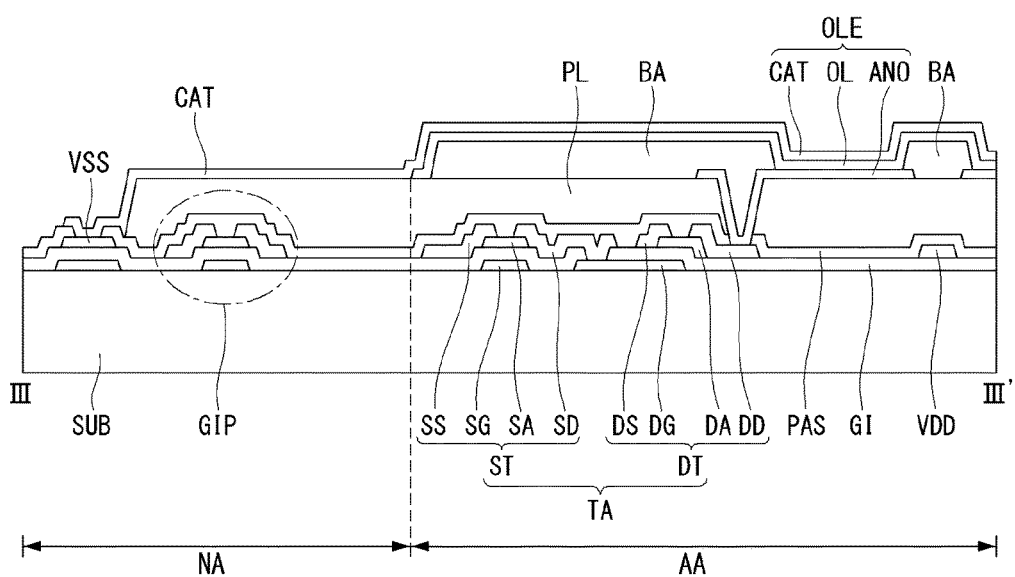
FIG. 11 is a cross sectional view illustrating a structure of the organic light emitting diode display along to the cutting line of III-III' in FIG. 10, according to the fourth application embodiment of the present disclosure.

FIG. 10 is an enlarged plane view illustrating a structure of an organic light emitting diode display according to a fourth application example of the present disclosure. FIG. 11 is a cross sectional view illustrating a structure of the organic light emitting diode display along to the cutting line of III-III' in FIG. 10, according to the fourth application example of the present disclosure. Here, as the explain is for the thin film transistor substrate embedding the drier element in the same substrate, the detailed explain about the thin film transistor and the organic light emitting diode may be omitted.

At first, referring to FIG. 10, we will explain about the plane structure of the organic light emitting diode display according to the fourth application example, in detail. An organic light emitting diode display according to the fourth application example comprises a substrate SUB including a display area AA for representing the video information and a non-display area NA having various elements for driving the elements in the display area AA. In the display area AA, a plurality of pixel areas PA disposed in a matrix manner are defined. In FIG. 10, the pixel area PA is illustrated as the dotted line.

For example, the pixel areas PA can be defined as an N (row)×M (column) matrix. However, the disposed pattern is not restricted this manner, but it has various type. Each of the pixel area PA has the same size or the different size. With one unit pixel having three sub pixels including red (R), green (G) and blue (B) sub pixels, the unit pixels are regularly disposed. Explaining with the simplest structure, the pixel area PA can be defined by the crossing structure of a plurality of gate lines GL running to horizontal direction and a plurality of data lines DL running to vertical direction.

In the non-display area NA defined as the circumstance area surrounding the pixel area PA, a data driving integrated circuit DIC for supplying the video data to the data line DL and a gate driving integrated circuit GIP for supplying the scan signal to the gate line GL are disposed. For that case of higher resolution display panel than VGA panel in which more data lines DL and more driving current lines VDD are required, the data driving integrated circuit DIC may be externally installed from the substrate SUB, and data contact pads may be disposed on the substrate SUB instead of the data driving integrated circuit DIC.

In order to simply show the structure of the display, the gate driving integrated circuit GIP is formed on one side portion of the substrate SUB directly. The ground line Vss for supplying the ground voltage may be disposed at the outermost side of the substrate SUB. The ground line Vss is disposed as to receive the ground voltage from external device located out of the substrate SUB, and to supply the ground voltage to the data driving integrated circuit DIC and the gate driving integrated circuit GIP. For example, the ground line Vss may be linked to the data driving integrated circuit DIC disposed at the upper side of the substrate SUB and to the gate driving integrated circuit GIP disposed at the right side and/or left side of the substrate SUB so as to surround the substrate SUB.

At each pixel area PA, the main elements such as an organic light emitting diode and thin film transistors for driving the organic light emitting diode are disposed. The thin film transistor is disposed at the thin film transistor area TA defined at one side of the pixel area PA. The organic light emitting diode includes an anode electrode ANO, a cathode electrode CAT and an organic light emission layer OL inserted between these two electrodes. The actual emission area is decided by the area of the organic light emission layer OL overlapping with the anode electrode ANO.

The anode electrode ANO has a shape as to occupy some area of the pixel area PA and is connected to the thin film transistor formed in the thin film transistor area TA. The organic light emission layer OL is deposited on the anode electrode ANO. The cathode electrode CAT is deposited on the organic light emission layer OL so as to cover whole surface of the display area AA having the pixel areas PA.

The cathode electrode CAT may go over the gate driving integrated circuit GIP and contact the ground line Vss disposed at the outer side. So, the ground voltage can be supplied to the cathode electrode CAT through the ground line Vss. The cathode electrode CAT receives the ground voltage and the anode electrode ANO receives the voltage corresponding to the video data and then, by the voltage difference between the cathode electrode CAT and the anode electrode ANO, the organic light emission layer OL radiates the light to represent the video information.

Further referring to FIG. 11, we will explain about the cross-sectional structure of the organic light emitting diode display according to the fourth application example, in detail. On the substrate SUB, a non-display area NA and a display area AA are defined. The non-display area NA includes the gate driving integrated circuit GIP and the ground line Vss are disposed. The display area AA includes a switching thin film transistor ST, a driving thin film transistor DT and an organic light emitting diode OLE are defined.

The gate driving integrated circuit GIP has thin film transistors which are formed when the switching thin film transistor ST and the driving thin film transistor DT are formed. The switching thin film transistor ST in the pixel area PA has a gate electrode SG, a gate insulating layer GI, a channel layer SA, a source electrode SS and a drain electrode SD. In addition, the driving thin film transistor DT has a gate electrode DG connected to the drain electrode SD of the switching thin film transistor ST, the gate insulating layer GI, a channel layer DA, a source electrode DS and a drain electrode DD.

On the thin film transistors ST and DT, a passivation layer PAS and a planar layer PL are sequentially deposited. On the planar layer PL, an anode electrode ANO having an isolation shape within the pixel area PA is disposed. The anode electrode ANO connects to the drain electrode DD of the driving thin film transistor DT through the contact hole penetrating the passivation layer PAS and the planar layer PL.

On the substrate SUB having the anode electrode ANO, a bank BA is deposited for defining the emission area. By patterning the bank BA, the most center portions of the anode electrode ANO are exposed. On the exposed anode electrode ANO, an organic light emission layer OL is deposited. Depositing a transparent conductive material on the bank BA and the organic light emission layer OL, the cathode electrode CAT is stacked. The organic light emitting diode OLED including the anode electrode ANO, the organic light emission layer OL and the cathode electrode CAT is disposed.

In the case that the organic light emission layer OL may generate the white lights, color filters CF may be further included for representing full color video information. In that case, the organic light emission layer OL would be preferably deposited as covering the whole surface of the display area AA.

The cathode electrode CAT is expanded over the gate driving integrated circuit GIP so that it may cover the display area AA and the non-display area NA and contact the ground line Vss disposed at the outer circumstance of the substrate SUB. As the result, the ground (or, reference) voltage can be supplied to the cathode electrode CAT via the ground line Vss.

In addition, the ground line Vss may be formed at the same layer and made of the same material with the gate electrodes SG and DG. In that case, the cathode electrode CAT can be connected to the ground line Vss through the contact hole penetrating the passivation layer PAS and the gate insulating layer GI over the ground line Vss. Otherwise, the ground line Vss may be formed at the same layer and made of the same material with the source-drain electrodes SS-SD and DS-DD. In this case, the cathode electrode CAT can be connected to the ground line Vss through the contact hole penetrating the passivation layer PAS over the ground line Vss.

In FIGS. 10 and 11 for explaining the fourth application example of the present disclosure, in convenience, the switching thin film transistor ST and the driving thin film transistor DT of the organic light emitting diode display are shown briefly. The first and/or the second thin film transistors T1 and/or T2 explained from the first to third embodiments of the present disclosure can be applied to these thin film transistors. For example, the second thin film transistor T2 having the oxide semiconductor material can be applied for the switching thin film transistor ST. The first thin film transistor T1 having the polycrystalline semiconductor material may be applied for the driving thin film transistor DT. Further, for the gate driver IC GIP, the first thin film transistor T1 having the polycrystalline semiconductor material may be applied. If required, for the gate driver IC GIP, the C-MOS type thin film transistor including P-MOS type and N-MOS type thin film transistors.

It will be apparent to those skilled in the art that various modifications and variations can be made in the thin film transistor substrate and display using the same of the present invention without departing from the spirit or scope of the invention. Thus, it is intended that the present invention cover the modifications and variations of this invention provided they come within the scope of the appended claims and their equivalents.

What is claimed is:

1. A thin film transistor substrate, comprising:
   a first thin film transistor including:
      a polycrystalline semiconductor layer;
      a first gate electrode on the polycrystalline semiconductor layer;
      a first source electrode; and
      a first drain electrode;
   a first gate insulating layer between the polycrystalline semiconductor layer and the first gate electrode;
   a second thin film transistor including:
      an oxide semiconductor layer on the first gate electrode;
      a second gate electrode on the oxide semiconductor layer;
      a second source electrode; and
      a second drain electrode;
   an intermediate insulating layer on the first gate electrode and under the oxide semiconductor layer; and
   a second gate insulating layer on the intermediate insulating layer and including:
      a first portion under the first source electrode;
      a second portion under the first drain electrode; and
      a third portion under the second gate electrode,
   wherein the first portion, the second portion, and the third portion are separated from each other by a passivation layer above the first source electrode and the first drain electrode.

2. The thin film transistor substrate of claim 1, wherein:
   the first source electrode contacts the polycrystalline semiconductor layer through a first source contact hole penetrating the second gate insulating layer, the intermediate insulating layer, and the first gate insulating layer;
   the first drain electrode contacts the polycrystalline semiconductor layer through a first drain contact hole penetrating the second gate insulating layer, the intermediate insulating layer, and the first gate insulating layer; and
   the second gate electrode overlaps middle portions of the oxide semiconductor layer having the second gate insulating layer there-between.

3. The thin film transistor substrate of claim 2, wherein the second gate insulating layer includes:
   the first portion having a same shape as the first source electrode;
   the second portion having a same shape as the first drain electrode; and
   the third portion having a same shape as the second gate electrode.

4. The thin film transistor substrate according to claim 1, wherein the intermediate insulating layer includes:
   a nitride layer; and
   an oxide layer on the nitride layer.

5. The thin film transistor substrate of claim 1, further comprising:
   a first light shielding layer under the polycrystalline semiconductor layer; and
   a second light shielding layer formed at a same layer and of a same material as the first gate electrode, and disposed under the oxide semiconductor layer.

6. The thin film transistor substrate of claim 1, wherein the first source electrode, the first drain electrode, and the second gate electrode are in a same layer and of a same material.

7. A thin film transistor substrate, comprising:
   a first semiconductor layer including a polycrystalline semiconductor material;
   a first gate insulating layer covering the first semiconductor layer;
   a first gate electrode on the first gate insulating layer and overlapping the first semiconductor layer;
   an intermediate insulating layer covering the first gate electrode;
   a second semiconductor layer disposed on the intermediate insulating layer, including an oxide semiconductor material;
   a second gate insulating layer on the intermediate insulating layer and the second semiconductor layer, and including a first portion, a second portion, and a third portion respectively overlapping one side of the first semiconductor layer, another side of the first semiconductor layer, and a middle portion of the second semiconductor layer;
   a second gate electrode on the second gate insulating layer and overlapping the middle portions of the second semiconductor layer;
   a first source electrode on the second gate insulating layer, and connecting the one side of the first semiconductor layer; and
   a first drain electrode on the second gate insulating layer, and connecting the another side of the first semiconductor layer,
   wherein the first portion, the second portion, and the third portion are separated from each other by a passivation layer above the first source electrode and the first drain electrode.

8. The thin film transistor substrate of claim 7, wherein:
   the first source electrode contacts the one side of the first semiconductor layer through a first source contact hole penetrating the second gate insulating layer, the intermediate insulating layer, and the first gate insulating layer; and
   the first drain electrode contacts the another side of the first semiconductor layer through a first drain contact hole penetrating the second gate insulating layer, the intermediate insulating layer, and the first gate insulating layer.

9. The thin film transistor substrate of claim 8, wherein the second gate insulating layer includes:
   the first portion having a same shape as the first source electrode;
   the second portion having a same shape as the first drain electrode; and
   the third portion having a same shape as the second gate electrode.

10. The thin film transistor substrate of claim 7, wherein the intermediate insulating layer includes:
    a nitride layer; and
    an oxide layer on the nitride layer.

11. The thin film transistor substrate of claim 7, further comprising:
    a passivation layer covering the first source electrode, the first drain electrode, and the second gate electrode; and
    a second source electrode and a second drain electrode disposed on the passivation layer, and respectively connecting one side of the second semiconductor layer and another side of the second semiconductor layer.

12. The thin film transistor substrate of claim 7, wherein the first source electrode, the first drain electrode, and the second gate electrode are in a same layer and of a same material.

\* \* \* \* \*